(12) United States Patent
Farquhar

(10) Patent No.: US 8,674,377 B2
(45) Date of Patent: Mar. 18, 2014

(54) OPTOELECTRONIC DEVICE PACKAGE, ARRAY AND METHOD OF FABRICATION

(75) Inventor: Donald Seton Farquhar, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 202 days.

(21) Appl. No.: 13/221,023

(22) Filed: Aug. 30, 2011

(65) Prior Publication Data

US 2013/0049022 A1 Feb. 28, 2013

(51) Int. Cl.
 *H01L 33/00* (2010.01)
(52) U.S. Cl.
 USPC .......... 257/88; 257/91; 257/99; 257/433; 257/E27.121; 257/E33.06; 438/33; 438/34; 438/61; 438/68; 438/69
(58) Field of Classification Search
 None
 See application file for complete search history.

(56) References Cited

U.S. PATENT DOCUMENTS

| | | | |
|---|---|---|---|
| 7,789,724 B2 | 9/2010 | Sung et al. | |
| 7,825,593 B2 | 11/2010 | Jung et al. | |
| 2006/0091794 A1 | 5/2006 | Agostinelli et al. | |
| 2009/0267507 A1 | 10/2009 | Takashima et al. | |
| 2010/0176389 A1 | 7/2010 | Chun et al. | |
| 2011/0186866 A1 | 8/2011 | Farquhar et al. | |

FOREIGN PATENT DOCUMENTS

| | | | |
|---|---|---|---|
| EP | 1596446 A2 | | 11/2005 |
| JP | 2004251981 | * | 9/2004 |
| JP | 2010282879 A | | 12/2010 |

OTHER PUBLICATIONS

The machine translation of JP 2004-251981.*
Donald Seton Farquhar, et al.; "Monolithic Parallel OLED Interconnect Structure"; Pending U.S. Appl. No. 12/570,024, filed Sep. 30, 2009; 15 pages.
Donald Seton Farquhar, et al.; "Optoelectronic Device Array"; Pending U.S. Appl. No. 12/696,510, filed Jan. 29, 2010; 26 pages.
Search Report and Written Opinion from corresponding PCT Application No. PCT/US2012/048218 dated Mar. 13, 2013.

* cited by examiner

*Primary Examiner* — Yasser A Abdelaziez
(74) *Attorney, Agent, or Firm* — Mary Louise Stanford

(57) ABSTRACT

An optoelectonice device package, an array of optoelectronic device packages and a method of fabricating an optoelectronic device package. The array includes a plurality of optoelectronic device packages, each enclosing an optoelectronic device, and positioned in at least one row. Each package including two geometrically parallel transparent edge portions and two geometrically parallel non-transparent edge portions, oriented substantially orthogonal to the transparent edge portions. The transparent edge portions are configured to overlap at least one adjacent package, and may be hermetically sealed. The optoelectronic device portion fabricated using R2R manufacturing techniques.

18 Claims, 7 Drawing Sheets

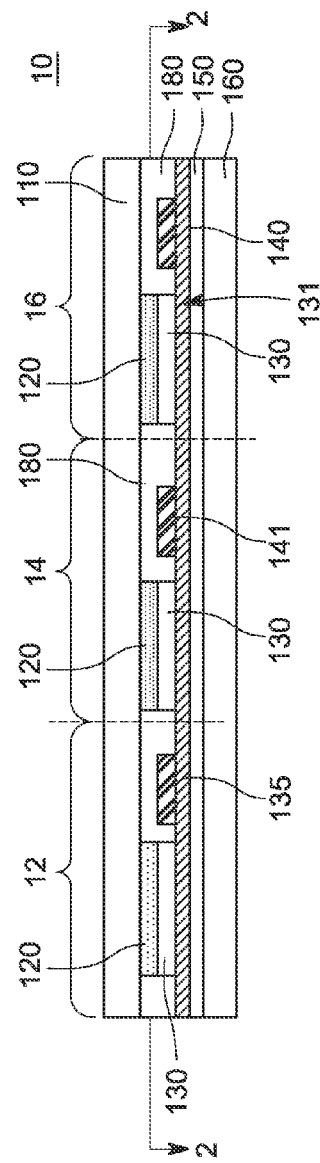

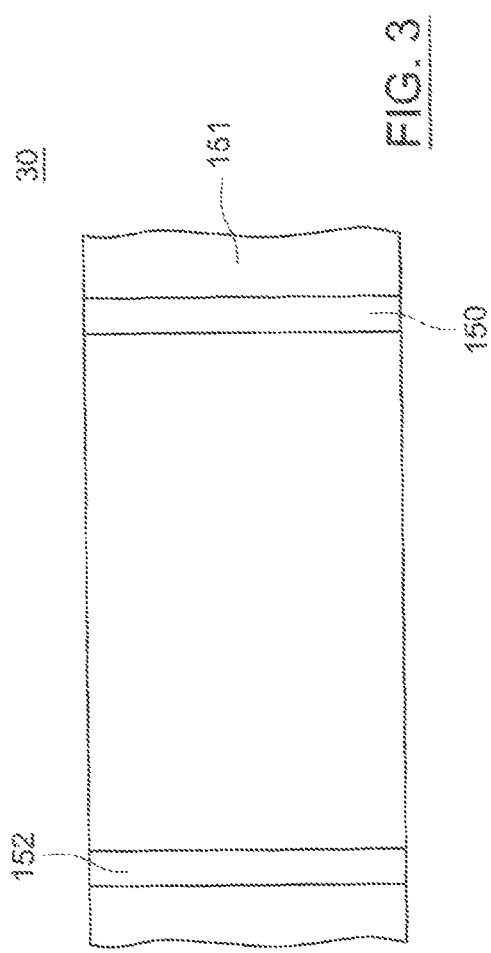
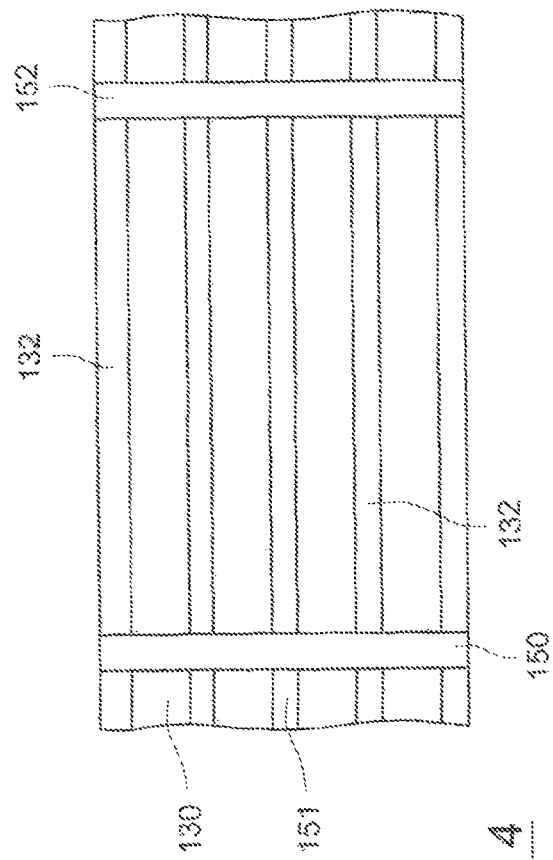

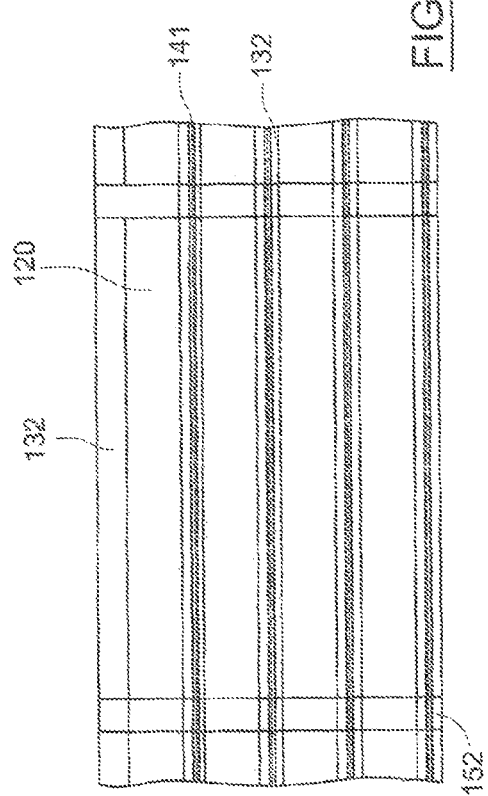
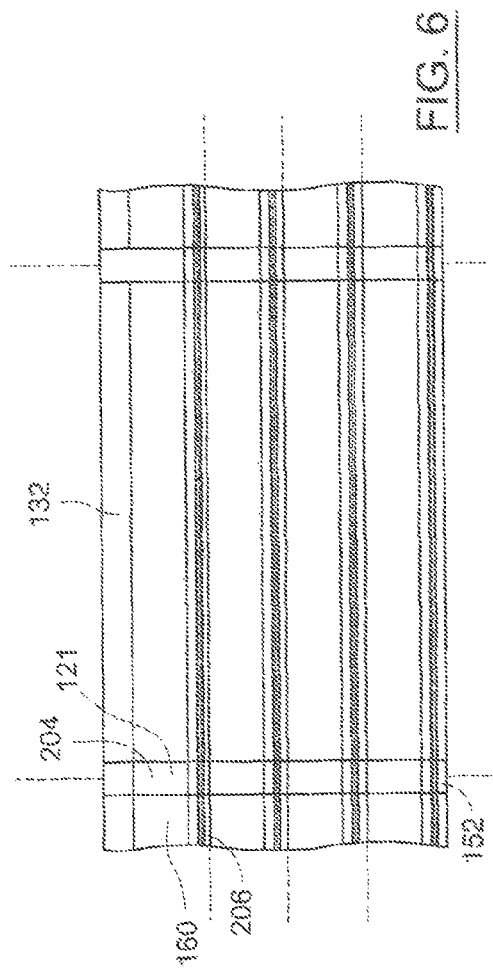

OPTOELECTRONIC DEVICE PACKAGE, ARRAY AND METHOD OF FABRICATION

BACKGROUND

Optoelectronic devices generally include light-emitting devices and photovoltaic devices. These devices generally include an active layer sandwiched between two electrodes, sometimes referred to as the front and back electrodes, at least one of which is typically transparent. The active layer typically includes one or more semiconductor materials. In a light-emitting device, e.g., an organic light-emitting diode (OLED) device, a voltage applied between the two electrodes causes a current to flow through the active layer. The current causes the active layer to emit light. In a photovoltaic device, e.g., a solar cell, the active layer absorbs energy from light and converts it to electrical energy which generates a flow of current at some characteristic voltage between the two electrodes.

The light is transmitted through at least one of the electrodes of an OLED device. The design of a suitable transparent electrode requires that it provide in-plane electrical conductivity (favoring a thicker layer of material) and that it provide optical transmission through its thickness (favoring a thinner layer of material). In an attempt to resolve these opposing constraints on the electrode design, the size of individual light emitting regions (pixels) may be limited, and as a result the amount of current that is flowing laterally in the plane of the electrode. If the current is low, the resistive losses in the electrode are low and the resulting device is efficient. In the one case, a pixel is defined by unlit lines that define its perimeter, and the current is bused to these regions. The unlit regions interrupt the otherwise uniform appearance of an OLED. The typical maximum dimension for a pixel in the direction of current flow is on the order of 1 cm before excessive loss and non-uniform appearance results. Approaches to solving this problem include making the unlit regions very small (increasing the complexity of the manufacturing process) or to obscure them with a diffusing film (reducing efficiency and adding cost). Thus, it is desirable to decrease the appearance of unlit regions so that large uninterrupted areas light can be created, while simplifying the manufacturing process to minimize costs. More generally, it is desirable to configure large arrays of lighted areas from individual pixels, or device packages, while providing design flexibility and ease in manufacture. In an attempt to decrease manufacturing costs, it is desirable to utilize manufacturing processes that allow printing light emitting devices onto flexible substrates in continuous roll-to-roll (R2R) fashion, similar to how newspaper is printed on large rolls of paper. With the utilization of R2R manufacturing, individual pixels or devices can be manufactured and configured into large arrays of lighted areas, wherein the pixels or devices are electrically connected in series, parallel or alternately individually addressable while maintaining ease in the manufacturing process.

BRIEF DESCRIPTION

Briefly, in one aspect, the present invention relates to an optoelectronic device package including an edge seal zone defining a transparent area along a first edge portion and a second edge portion and an edge seal zone defining a non-transparent area along a third edge portion and a fourth edge portion. The first and second edge portions are geometrically parallel portions of the optoelectronic device package. The third and fourth edge portions are geometrically parallel edge portions, and oriented substantially orthogonal to the first edge portion and the second edge portion of the optoelectronic device package. At least one of the transparent first and second edge portions of the edge seal zone is configured to overlap at least one adjacent optoelectronic device package. The non-transparent third and fourth edge portions of the edge seal zone comprising a conductive layer configured to connect an anode and a cathode of the optoelectronic device to an external power source via a plurality of contacts.

In another aspect, the present invention relates to an array including a plurality of optoelectronic device packages positioned in at least one row, each enclosing an optoelectronic device that includes an edge seal zone defining a transparent area along a first edge portion and a second edge portion and an edge seal zone defining a non-transparent area along a third edge portion and a fourth edge portion. The first and second edge portions are geometrically parallel portions of the optoelectronic device package. The third and fourth edge portions are geometrically parallel edge portions, and oriented substantially orthogonal to the first edge portion and the second edge portion of the optoelectronic device package. At least one of the transparent first and second edge portions of the edge seal zone is configured to overlap at least one adjacent optoelectronic device package. The non-transparent third and fourth edge portions of the edge seal zone comprising a conductive layer configured to connect an anode and a cathode of the optoelectronic device to an external power source via a plurality of contacts. Each optoelectronic device package overlaps at least one adjacent optoelectronic device package.

In another aspect, the present invention relates to an OLED lighting array forming a continuous lighted area. The OLED lighting array comprising a plurality of packages, each enclosing an optoelectronic device, and arranged in at least one row. Each package comprising an electroactive area and an edge seal zone defining a transparent portion and a non-transparent portion, the non-transparent portion comprising a conductive layer configured to connect the optoelectronic device to an external power source via a plurality of terminals. The transparent portion of the edge seal zone of each package overlaps the electroactive area of an adjacent package. The electroactive area of each adjacent package in the row overlaps the non-transparent portion of the edge seal zone of an adjacent package in the row. The transparent edges of each package are aligned along a linear anode bus line.

In yet another aspect, the present invention relates to a method of fabricating an optoelectronic device package using roll-to-roll (R2R) manufacturing techniques comprising: positioning a segment of a substrate material; depositing a layer of transparent conductive oxide (TCO) on the substrate material; forming a cross web area on the substrate material; depositing an electroactive layer on the transparent conductive oxide (TCO) in a series of spaced apart discontinuous stripes thereby defining a plurality of electroactive layer stripes, wherein the step of depositing the electroactive layer includes leaving a gap between the electroactive layer and the perimeter of the substrate on at least two parallel longitudinal edges; depositing a metal layer on each of the plurality of electroactive layer stripes in a plurality of continuous stripes, thereby defining a plurality of cathode layer stripes and an anode bus line; depositing an anode layer on the transparent conductive oxide (TCO) in a plurality of continuous stripes, thereby defining a plurality of anode bus lines, wherein the step of depositing the anode layer includes leaving a gap between the each of the plurality of anode bus lines and the cathode layer stripes; depositing a transparent barrier layer on top of the anode and cathode layers, wherein the barrier layer is configured to expose portions of each of the cathode layer stripes and the anode layer stripes; and excising to form individual optoelectronic device packages.

In yet another aspect, the present invention relates to a method of fabricating an optoelectronic device package using roll-to-roll (R2R) manufacturing techniques. The method comprises positioning a segment of a substrate material; depositing a layer of transparent conductive oxide (TCO) on the substrate material; depositing a conductive layer on the transparent conductive oxide (TCO) in a series of spaced apart continuous stripes, thereby defining a plurality of anode bus lines, wherein the step of depositing the conductive layer includes leaving a gap between the conductive layer and the perimeter of the substrate on at least two parallel longitudinal edges; depositing an insulating layer on each of the plurality of anode bus lines in a series of spaced apart of continuous stripes; depositing an electroactive layer between the plurality of anode bus lines in a continuous stripes thereby defining an electroactive layer stripe; depositing a metal cathode layer on the electroactive layer stripe in a continuous stripe, thereby defining a cathode layer stripe; depositing a transparent barrier layer on top of the electroactive layer stripe; and excising to form individual optoelectronic device packages.

These and other advantages and features will be better understood from the following detailed description of preferred embodiments of the invention that is provided in connection with the accompanying drawings.

BRIEF DESCRIPTION OF THE DRAWINGS

The above and other aspects, features, and advantages of the present disclosure will become more apparent in light of the subsequent detailed description when taken in conjunction with the accompanying drawings in which:

FIG. 1 is a cross sectional view of a package for use in the arrays according to an embodiment;

FIG. 2 is a sectional view through layers of a package used in the lighting arrays according to the embodiment of FIG. 1;

FIGS. 3-6 are schematic views of steps in a method of fabricating a package for use in the arrays according to the embodiment of FIG. 1;

DETAILED DESCRIPTION

Figure 7:
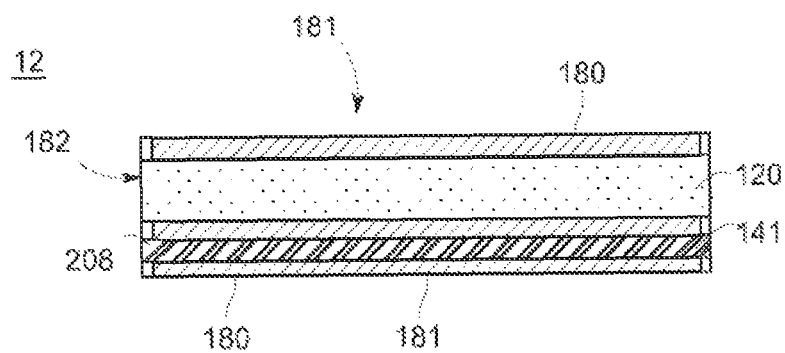
FIG. 7 is a schematic view of a single device package for use in the arrays according to the embodiment of FIG. 1

Referring now to the drawings, in which like numerals refer to like elements throughout the several views, FIG. 1 is a cross sectional view of plurality of adjoined optoelectronic device packages, generally referenced 10, during an interim stage of manufacture, and more particularly prior to excising to define a first optoelectronic device package 12, a second optoelectronic device package 14 and a third optoelectronic device package 16. Each device package 12, 14 and 16 being suitable for use in a lighting array of the present invention. More particularly, illustrated is device structure 10 showing a first barrier layer 110, first electrode layer 120, additional metal 140 co-deposited with first electrode layer 120, electroactive layer(s) 130, second electrode layer 135, an optional substrate 150 and second barrier layer 160. In embodiments where substrate 150 is not present, the layers may be disposed directly on the second bather layer 160. An optional adhesive layer (not shown) may be disposed between the first barrier layer 110 and the first electrode layer 120, and between the first barrier layer 110 and the substrate 150, forming an edge seal zone 180. In some embodiments, the second electrode layer 135 may be coextensive with the substrate 150, and the adhesive layer 170 may be partially disposed on the second electrode layer 135, forming the edge seal zone 180. In other embodiments, the substrate 150 may be coextensive with layers 160 and 180. The geometry of the edge seal zone 180 is designed to minimize ingress of water and oxygen; the adhesive layer 170 forming the bond between first and second barrier layers 110 and 160 is thin and broad and thus provide the preferred geometry. The adhesive material of adhesive layer 170 is selected to provide a strong bond between the substrate and the backsheet, and to be relatively impermeable to moisture and oxygen ingress. The adhesive is free from moisture and chemically inert so that it does not degrade the materials that make up the device, particularly the electrode and the materials of the electroactive layers. To the extent that adhesive layer 170 extends to the edge seal zone 180 beyond the light emitting region, it should be transparent. A wide range of adhesives including transparent thermoplastics, pressure sensitive adhesives, acrylics, and thermosetting epoxies and urethanes are potentially suitable. Low cost materials and processing are, for example, enabled by selecting a heat seal material such as Rohm & Haas Adcote 37T77 which is provided as a dispersion that can be pre-applied to the barrier layers and then dried. Lamination of the barrier layers 160 and 180 to the device then can be completed with brief exposure to moderate heat and pressure, for example in a continuous roll lamination process. An optional adhesive layer (not shown) may be disposed between the second electrode layer 135 and the second barrier layer 160 when the substrate 150 is present.

The substrate 150 and the first and second barrier layers 110, 160 may be opaque or transparent, although at least one surface of the device, that is, the first barrier layer 110 or the substrate 150 and/or the second barrier layer 160 is transparent in order that light emitted or absorbed by each of the devices 12, 14 and 16 may pass through from or to the electroactive layer(s) 130. In one example, the substrate 150 is transparent and composed of glass or a plastic such as polyesters (PET, PEN). The barrier layers 110, 160 are each relatively impermeable to moisture and oxygen; transparent materials suitable for use as a barrier layer include glass and ultra high barrier (UHB) films, for example, as described in U.S. Pat. Nos. 7,015,640, 7,154,220, and 7,397,183 assigned to the General Electric Company. Metal foils are suitable for opaque barrier layers. The second electrode layer 135 may be either a cathode or an anode; in a preferred embodiment, the second electrode layer 135 is the anode. In particular, the second electrode layer 135 may be an anode composed of a transparent conductive oxide (TCO), such as indium tin oxide (ITO). The electroactive layer(s) 130 is (are) one or more layers that form an electroactive area 131, and collectively act to emit (for an OLED device) or absorb (for a PV device) light, and may include hole and electron injecting layers, hole and electron transporting layers and emissive layers. Various means of depositing the electroactive layer(s) 130 are known in the art, including vacuum and non-vacuum processes. Materials suitable for use in OLED devices and PV devices are well known and will not be described here in detail. Manufacture of device structure 10 will be described presently.

FIG. 2 is a transverse sectional view through the first electrode layer 120 of the multiple device structure 20 that is suitable for use in the lighting arrays of the present invention, showing the first electrode (cathode) layer 120, the second electrode (anode) layer 135, an anode bus line 141, and exposed layers 190 that underlie the first electrode layer 120 and the second electrode layer 135. In a particular embodiment, the anode bus line 141 and the first electrode layer (cathode) 120 are deposited in a single deposition step. A plurality of excise lines 202 are depicted to illustrate where the device structure 20 is excised during manufacturing to form each individual optoelectronic device 12, 14 and 16. Device structure 20 is depicted as including three separate devices, or pixels, but may include multiple smaller devices/ pixels or multiple greater devices/pixels in light of the manufacturing method (described presently).

As described presently, the device structure 20 includes the barrier (or insulating) layer 110 laminated thereon the device structure 20. More specifically, during manufacture of device structure 20, the barrier layer 110 is laminated on an uppermost surface of the first electrode layer 120 and the second electrode layer 135. The barrier layer 110 is typically thin, and has about the same thickness as the electroactive area 130 (FIG. 1 not drawn to scale). The barrier layer 110 helps to define the edge seal zone 180, and does not extend into electroactive area 130. The bather layer 110 may be composed of various organic or inorganic insulators. In one example, a low viscosity cyanoacrylate adhesive with a viscosity of about 1-10 cPs may be applied to form a thin insulating coating subsequent to depositing the anode and cathode layers. In another example, a thin layer (less than 1 micron) of inorganic silicon dioxide may be deposited through a mask to form the barrier layer 110. Organic materials may be applied by any of various printing or coating techniques; inorganic materials may be deposited by vapor deposition methods, for example, vacuum evaporation, sputtering, and chemical vapor deposition. Subsequent to deposition of the barrier layer 110, a portion of the first electrode (cathode) layer 120 and the second electrode (anode) layer 135 are exposed to provide for electrical connections to each individual device 12, 14 and 16.

Referring now to FIGS. 3-6, illustrated in top plan views are steps in the method of manufacturing the device structure 20 as previously described. As previously alluded to, roll-to-roll (R2R) manufacturing techniques are utilized in the manufacture of the device structure 20. R2R manufacturing may also be referred to herein as web processing or reel-to-reel processing. In general, R2R processing is a manufacturing method in which electronic devices are configured on a roll or web of material, such as a flexible plastic or metal foil. The process may include printing, or performing other processes starting with a roll of a flexible material and re-reeling after the process to create an output roll.

In a non-limiting example, illustrated in FIG. 3 is a segment 30 of a roll film used for R2R processing of the device structure 20. Initially, the substrate 150 is provided and a TCO layer 151, such as indium-tin-oxide (ITO), is provided on the substrate 150; a transparent UHB layer (not shown) may be provided between the TCO layer 151 and the substrate 150 or on the other surface of the substrate 150. The substrate 150 may be provided in a continuous roll format or as a material positioned on a continuous roll, such as a web or the like, so that portions of multiple regions may be coated. A cross-web area 152 is formed to expose a portion of the substrate 150, or underlying layer. The cross-web area 152 may be formed by removing a portion of the TCO layer 151. More specifically, the TCO anode may be selectively removed by an etching process, thus exposing the bare substrate 150 and obviating the need for an insulating layer (described presently). In an alternate embodiment, an insulating layer may be deposited on the TCO layer 151 to define the cross-web area 152. The insulating layer may be composed of an organic material and applied to the unpatterned TCO layer 151 from a low viscosity coating composition by any of various printing or coating techniques, or an inorganic insulating layer may be deposited on the unpatterned TCO layer 151 by vacuum evaporation or other vapor deposition methods. The step height difference at the edge of the coating is typically minimized Referring now to FIG. 4, the electroactive layer(s) 130 are next deposited directly on the TCO layer 151 in a discontinuous deposition step, resulting in substantially continuous stripes of the electroactive layers 130 formed in a longitudinal direction relative to the web or roll used in the R2R processing. The electroactive layers 130 are deposited leaving a gap 132 between the electroactive area and the perimeter of the substrate 150 on some or all edges and between the stripes of electroactive layers 130. The electroactive layers 130 are deposited in a discontinuous longitudinal process so as to leave exposed the cross-web area 152.

Referring now to FIG. 5, the first electrode layer 120, and more particularly a cathode 121, is deposited directly on the electroactive layers 130 and the cross-web portions 152 in a continuous longitudinal stripe process, to define a plurality of continuous cathode stripes. The first electrode layer 120 may be formed through a mask, for example, via a vapor deposition process or a printing-type process using conductive ink. In addition, the second electrode layer 135, and the anode bus line 141, is deposited overlying the substrate 150 and the cross-web portions 152 in a continuous longitudinal stripe process, and separated a distance from the first electrode layer 120, thereby defining a continuous anode stripe. The second electrode layer 120 may be formed through a mask, for example, via a vapor deposition process or a printing-type process using conductive ink. Depositing the first electrode layer 120 and the second electrode layer 135 in a R2R continuous striping technique, eliminates the need for stopping and starting the deposition step (such as metal evaporation, or the like), which is costly due to the necessity to register the device, align the system, and the requirements of uniformity, heating, masks, etc. As best illustrated in FIG. 5, the gap 132 between the electroactive area and the perimeter of the substrate on some or all edges and between the stripes of electroactive layers 130, first electrode layer 120 and second electrode layer 135 remains defined and provides for electrical separation.

The first electrode layer 120 and the second electrode layer 135 include transparent or opaque conductive layers. Suitable materials for the first and second electrode layers 120 and 135 are known in the art and include metals in elemental form, such as aluminum and silver, and transparent conductive oxides such as ITO and zinc tin oxide. In particular, a thin layer of aluminum may be used.

Referring now to FIG. 6, the barrier layer 160 is next deposited, or laminated, on a top surface of the first electrode layer 120 and the second electrode layer 135 in a discontinuous stripe, so as to expose a portion 204 of the first electrode layer 120 coextensive with the cross-web area 152 to define the cathode 121, and a portion 206 of the metal layer 140 coextensive with the cross-web area 152 to define the anode bus line 141. To define the plurality of devices 12, 14 and 16, the device structure 30 is next cut along excise lines 202 to expose the plurality of devices 12, 14, and 16.

The edge seal zone 180 is defined about each resultant device 12, 14, and 16, of which a single excised device 12 is illustrated in FIG. 7. The device 12 includes a conductive area 208 in electrical communication with the anode bus line 141, that is composed of two conductive layers, and more specifically, the second electrode layer 135 and an extension of cathode 121, that is composed of the first electrode layer 120. The underlying layers are exposed there between to prevent shorting between the conductive layers.

Hermetic packaging of the device is completed using suitable structures and methods. Various types of hermetic packages and methods for manufacturing them have been described in U.S. patent application Ser. No. 12/336,683, filed on 17 Dec. 2008, Ser. No. 12/510,463, filed on 28 Jul. 2009, and Ser. No. 12/470,033, filed on 21 May 2009, and Ser. No. 12/570,024, filed on 30 Sep. 2009, the entire contents of which are incorporated within by reference. For example, a transparent protective backsheet may be bonded to the back of the device. The protective backsheet may be positioned and aligned with the substrate so that part of edge seal zone 180 in electrical communication with the anode and the cathode is exposed. Suitable materials for the transparent backsheet include glass or plastic with a barrier film. It may be bonded to the underlying layers with an optically transparent adhesive that is typically selected to provide a strong bond, and is free from moisture and chemically inert so that it does not degrade the OLED, and relatively impermeable to moisture and oxygen edge ingress. The seal geometry is designed to be sufficiently thin and wide to minimize ingress.

In the embodiment described with reference to FIGS. 1-7, the resultant optoelectronic device package includes first and second geometrically parallel transparent edge portions 181 and third and fourth non-transparent or opaque geometrically parallel edge portions 182, oriented substantially orthogonal to the first and second geometrically parallel transparent edge portions 181. The transparent edge portions permitting tiling of multiple devices in a display (described presently). In the previously described embodiment, the anode bus line 141 is configured to carry the current alongside the active cathode 121 area, equating to a smaller voltage drop across the device. The fabrication of the anode bus line 141 does not add complexity to the manufacturing process in that it may be deposited in the same R2R deposition step as the first electrode layer 120, or cathode, and has no longitudinal direction registration requirement. In addition, tiling and busing of the disclosed device occur after the device is fabricated and hermetically sealed. In contrast, in prior art devices, the devices are tiled and bused prior to sealing adding additional cost and complexity.

Figure 8:
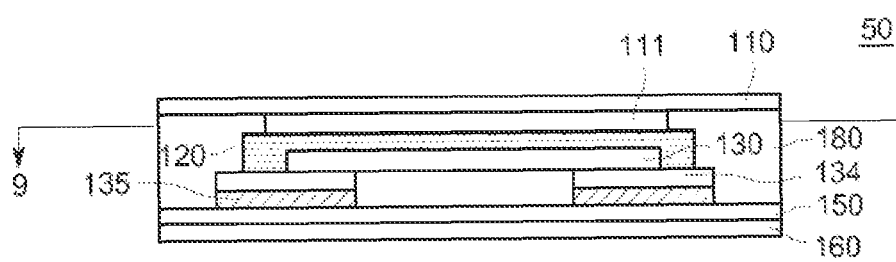
FIG. 8 is a cross sectional view of a package for use in the arrays according to another embodiment.

Referring now to FIGS. 8-15, illustrated is another embodiment of an optoelectronic device, wherein a plurality of material layers are deposited in a continuous stripe along the length of the web during R2R manufacturing, thus exploiting well known coating techniques, such as roller, inkjet, or slot die, without any need for stopping and starting of the deposition process. Again, it is noted that like numerals refer to like elements throughout the several views, More particularly, referring to FIG. 8, illustrated is a cross sectional view of an optoelectronic device structure 50, including a plurality of individual devices as will be described. The device structure 50 being suitable for use in a lighting array of the present invention. Illustrated is structure 50 showing a first barrier layer 110, an insulating layer comprised of a backsheet 111, a first electrode layer 120, an electroactive layer(s) 130, an insulating layer 134, a second electrode layer 135, an optional substrate 150 and second barrier layer 160. In embodiments where the substrate 150 is not present, the layers may be disposed directly on the second barrier layer 160. An optional adhesive layer (not shown) may be disposed between the first barrier layer 110 and the first electrode layer 120, and between the first barrier layer 110 and the substrate 150, forming an edge seal zone 180. In one embodiment, the substrate 150 may be coextensive with the barrier layers 110 and 160. The geometry of the edge seal zone 180 is designed to minimize ingress of water and oxygen; adhesive layer 170 forming the bond between the first and second barrier layers 110 and 160 is thin and broad and thus provide the preferred geometry. Similar to the previous embodiment, to the extent that adhesive 170 extends to the edge seal zone 180 beyond the light emitting region, it should be transparent. Lamination of the barrier layers to the device can be completed with brief exposure to moderate heat and pressure, for example in a continuous roll lamination process. An optional adhesive layer (not shown) may be disposed between the second electrode layer 135 and the second barrier layer 160.

The substrate 150 and the first and second barrier layers 110 and 160 may be opaque or transparent, although at least one surface of the device, that is, the first barrier layer 110 or the substrate 150 and/or the second barrier layer 160 is transparent in order that light emitted or absorbed by the device 50 may pass through from or to electroactive layer(s) 130. In one example, the substrate 150 is transparent and composed of glass or a plastic such as polyesters (PET, PEN). The barrier layers 110, 160 are each relatively impermeable to moisture and oxygen; transparent materials suitable for use as a barrier layer include glass and ultra-high barrier (MB) films as previously described. Metal foils are suitable for opaque barrier layers. The second electrode layer 135 may be either a cathode or an anode; in a preferred embodiment, second electrode 135 is the anode. In particular, the second electrode layer 135 may be an anode composed of indium tin oxide (ITO). The electroactive layer(s) 130 is (are) one or more layers that collectively act to emit (for an OLED device) or absorb (for a PV device) light, and may include hole and electron injecting layers, hole and electron transporting layers and emissive layers. As previously mentioned, various means of depositing the layers are known in the art, including vacuum and non-vacuum processes. Manufacture of structure 50 will be described presently.

Figure 9:
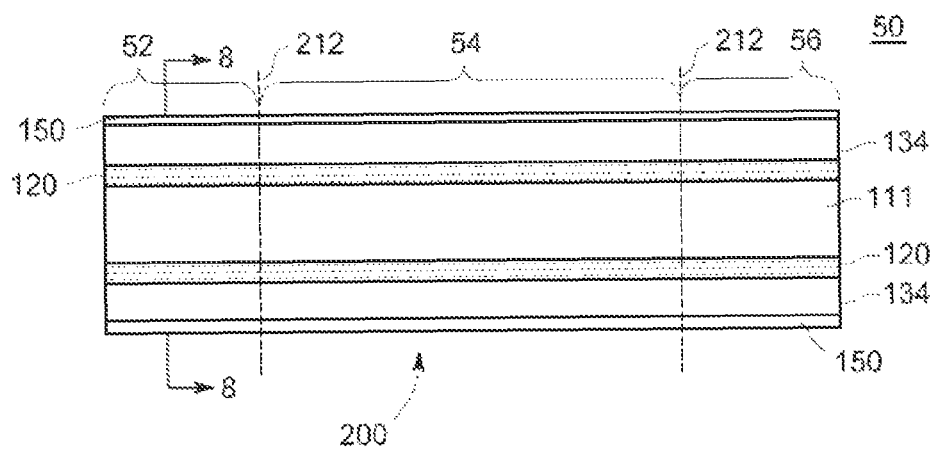
FIG. 9 is a sectional view through layers of a package used in the lighting arrays according to the embodiment of FIG. 8.

FIG. 9 is a transverse sectional view through the backsheet, or insulating, layer 111 of the structure 50 that is suitable for use in the lighting arrays of the present invention, showing the first electrode (cathode) layer 120, the insulating layer 134, the second electrode (anode) layer 135 configured as an anode bus line 141, and exposed layers that underlie the second electrode layer 135, the insulating layer 134 and the first electrode layer 120 and include the substrate 150, and/or barrier layer(s). In a particular embodiment, the electrode is comprised of the second electrode layer 135 and more particularly the anode bus line 141. An electroactive area 200 includes longitudinally central portion of the device 50. A plurality of excise lines 202 are depicted to illustrate where the device structure 50 is excised during R2R manufacturing to form a plurality of individual light emitting devices 12, 14, and 16.

As described presently, the device structure 50 includes the barrier (or insulating) layer 110 laminated thereon the device structure 50. The barrier layer 110 helps to define the edge seal zone 180, and does not extend into electroactive layers 130. The barrier layer 110 may be composed of various organic or inorganic insulators as previous detailed with respect to the first disclosed embodiment.

Figure 10:
FIGS. 10-15 are schematic views of steps in a method of fabricating a package for use in the arrays according to the embodiment of FIG. 8.

Referring now to FIGS. 10-15, illustrated in top plan views are steps in the method of manufacturing the device structure 50 as previously described. As in the previous embodiment, roll-to-roll (R2R) manufacturing techniques are utilized in the manufacture of the device structure 50. In a non-limiting example, illustrated in FIG. 10 is a segment 30 of a roll film used for R2R processing of the device structure 50. Initially, a transparent conductive oxide (TCO), such as an ITO layer 151 is provided on the substrate 150; a transparent UHB layer (not shown) may be provided between the ITO layer 151 and the substrate 150 or on the other surface of the substrate 150. The substrate may be in a continuous roll format or positioned on a continuous roll, such as a web or the like, so that portions of multiple regions may be coated. In contrast to the previous embodiment, device structure 50 does not include a cross-web area to expose a portion of the substrate 150, or underlying layer(s).

Figure 11:
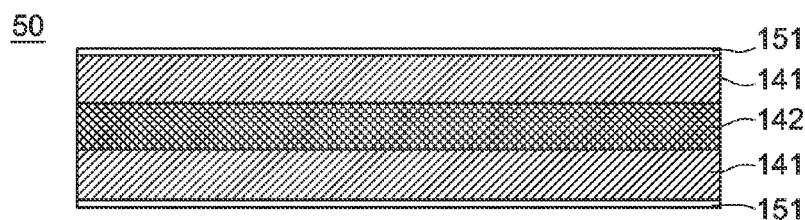

Referring now to FIG. 11, the second electrode layer 135, and more particularly the anode bus line 141, is deposited directly on the substrate 150, and any intermediary layers, such as ITO or UHB. The electrode layer 135 is deposited in a continuous longitudinal stripe process. Simultaneous with the deposition of the electrode layer 135, an optional anode grid 142 may be deposited on substrate 150, and any intermediary ITO or UHB layers. The anode grid 142 enables the manufacture of a much wider pixel and potentially obviates the need for shingling and tiling of a plurality of optoelectronic devices in some applications. Irrespective of the inclusion of the anode grid 142, the anode bus line 141 is formed longitudinally along an edge portion of the device structure 50. Although the anode bus line 141 is depicted in FIGS. 10-15 as being present on either side of the device structure 50, it is anticipated that the anode bus line 141 may be present on only one side, with the configuration dependent upon the required width of the resultant pixel and the need to have another transparent edge due to tiling requirements. The electrode layer 135 may be formed through a mask, for example, via a vapor deposition process or a printing-type process using conductive ink.

Figure 12:
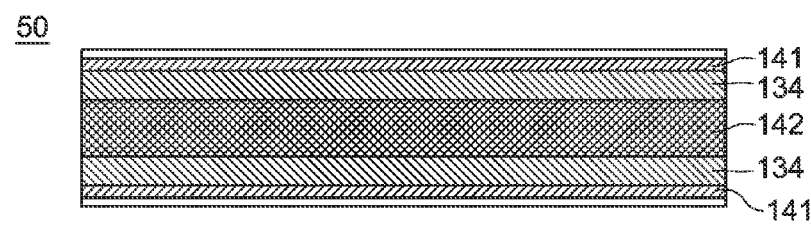

As best illustrated in FIG. 12, an insulating layer 134 is next deposited on the anode bus line 141 in a continuous longitudinal striping process. The insulating layer 134 may be composed of an organic material and applied to the electrode layer 135 from a low viscosity coating composition by any of various printing or coating techniques, or an inorganic insulating layer may be deposited on the electrode layer 135 by vacuum evaporation or other vapor deposition methods.

Figure 13:
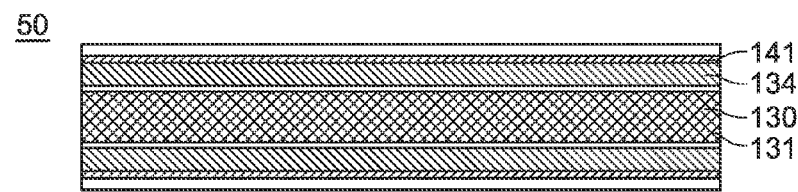

The electroactive layer(s) 130 are next deposited on the anode grid 142 and a portion of the electrode layer 135 as depicted in FIG. 13. The electroactive layer(s) 130 is deposited in a manner having a width that is greater than the spacing of the anode layer 135. The electroactive layer(s) 130 is deposited in a continuous longitudinal stripe process, as previously described, resulting in a substantially continuous stripe of electroactive layer 130 formed in a longitudinal direction relative to the web or roll used in the R2R processing.

Figure 14:
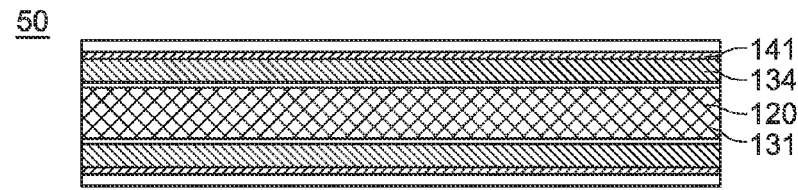

Referring now to FIG. 14, the first electrode layer 120, and more particularly the cathode 121, is deposited directly on the electroactive layer(s) 130 in a continuous longitudinal striping process. The first electrode layer 120 may be formed through a mask, for example, via a vapor deposition process or a printing-type process using conductive ink. The first electrode layer 120 and the second electrode layer 135 may include transparent or opaque conductive layers. Suitable materials for the first and second electrode layers 120 and 135 are known in the art and include metals in elemental form, such as aluminum and silver, and transparent conductive oxides such as ITO and zinc tin oxide. In particular, a thin layer of aluminum may be used.

Figure 15:
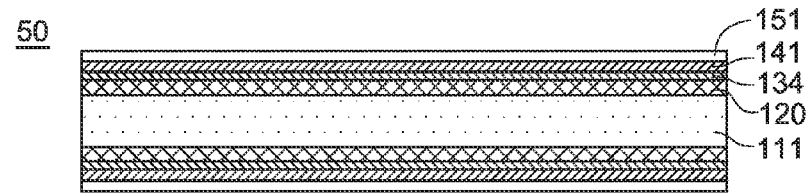

Referring now to FIG. 15, the protective backsheet 111 is next deposited, or laminated, on a top surface of the first electrode layer 120 in a longitudinally continuous stripe. The protective backsheet 111 may be positioned and aligned with the substrate so that part of edge seal zone 180 in electrical communication with the anode and the cathode is exposed or deposited as illustrated on the electrode layer 120 whereby a portion of the electrode layer 120 remains uncovered. Suitable materials for the transparent backsheet include glass or plastic with a barrier film. It may be bonded to the underlying layers with an optically transparent adhesive that is typically selected to provide a strong bond, and is free from moisture and chemically inert so that it does not degrade the OLED, and relatively impermeable to moisture and oxygen edge ingress. The seal geometry is designed to be sufficiently thin and wide to minimize ingress. To define the plurality of devices 52, 54 and 56, the device structure 50 is next cut along excise lines 212 (FIG. 9) to define the plurality of devices 52, 54, and 56. Hermetic packaging of the device 50, or individual devices 52, 54, and 56, is completed using suitable structures and methods as previously disclosed herein.

Each of the individual devices 52, 54, and 56 is suitable for integration by shingling, including an anode bus line 141 along one, or more, edges. In contrast to the previous embodiment, R2R manufacturing processes allow for the minimization, if not elimination, of one or more stop/start operations during the fabrication of the device structure 50. In addition, the devices produced in the R2R process are hermetically sealed and may be sorted for yield and/or performance, and then matched together for tiling. Similar to the previous embodiment, in the embodiment described with reference to FIGS. 8-15, the resultant optoelectronic device packages 52, 54 and 56 each include first and second geometrically parallel transparent edge portions and third and fourth geometrically parallel non-transparent or opaque edge portions, oriented substantially orthogonal to the first and second geometrically parallel transparent edge portions, thereby permitting tiling of multiple devices in a display (described presently).

Illustrated in FIGS. 16-20 are various tiling layouts for the optoelectronic device package as previously described with regard to FIGS. 1-15. In the illustrated embodiments, shingling of a plurality of optoelectronic packages, also referred to herein as organic light emitting diodes (OLEDs), are provided each having a dimension of approximately 15.0 cm×2.5 cm and including at least one transparent edge. In each plan view, illustrated is an optoelectronic package having a transparent edge portions, generally similar to edge seal zone 180 previously described, an electroactive area, generally similar to the electroactive area 130 previously described and a plurality of non-transparent edge portions, generally similar to the non-transparent edge portions previously described. One of the non-transparent edge portions contains the anode and one of the non-transparent edge portions contains the cathode of the device. Conductive areas 208 and optional conductive tab contacts are provided in electrical communication with the anodes and cathodes. In additional electric leads (not shown) may be connected between the conductive tabs and a power supply. Depending on the connector mounting scheme, the design of the contacts may vary. The figure depicts ribbon-type conductors that may be attached to the cathode and anode metal using a conductive adhesive. Whereas the conductive tabs may extend inward between the backsheet and the substrate, in some embodiments, it may be preferable to place them in an outboard configuration so that they do not interfere with sealing the edge. In other embodiments, the conductive tabs may be printed as a thin metal layer on the backsheet. Contact to the anode and cathode may be made with conductive adhesive. In addition, it may be desirable to add another layer on top of the electrode metallization adjacent to the backsheet that is resistant to attack from the environment, especially in the edge region that may remain exposed after backsheet application. This could in the form of a non-corroding metal, or it could be a UHB or other organic or inorganic barrier layer. Tiling of the packages provides a reduction in dark lines between individual pixels. As described presently, the optoelectronic device packages are suitable for tiling in parallel, series or individually addressable OLED configurations.

Figure 16:
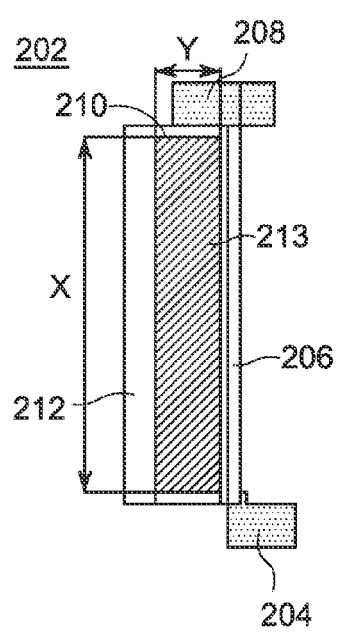
FIG. 16 is a schematic view of an optoelectronic device package for use in the array according to an embodiment.
Figure 17:
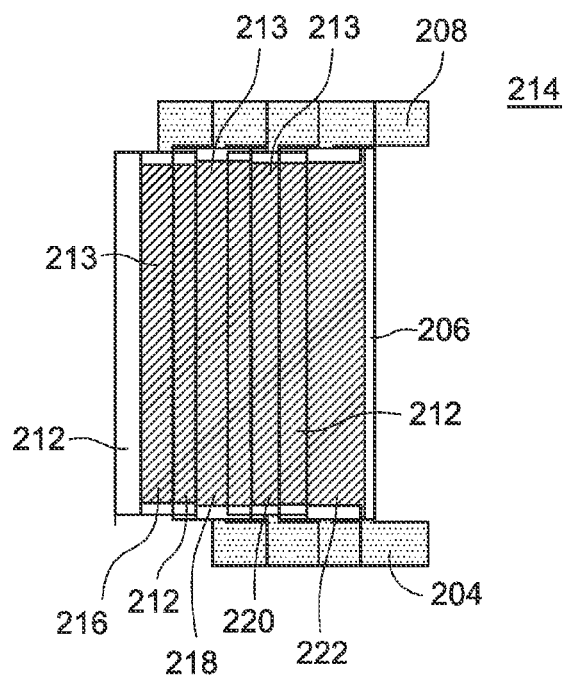
FIG. 17 is an array according to an embodiment showing overlapping packaged optoelectronic devices of FIG. 16 oriented geometrically parallel to each other.

Referring specifically to FIG. 16, illustrated is a schematic view an individual optoelectronic device package 202, manufactured and configured as previously described with regard to either FIG. 1-6 or 8-15, for implementation in a parallel shingling layout and addressable in parallel. A first electrical conductive tab 204 is in electrical communication with an anode bus line 206, generally similar to anode bus line 141 previously described. A second electrical conductive tab 208, is provided in electrical communication with a cathode 210, generally similar to cathode 121 previously described. An electroactive area 213, generally similar to electroactive area 131 previously described, is formed adjacent a transparent edge seal zone 212. The edge seal zone 212, generally similar to transparent edge seal zone 180 previously described provides for overlapping of a plurality of device packages to form an array. In this exemplary embodiment, the device package 202 is approximately 15.25 cm, as indicated at X, by 2.54 cm as indicated at Y. Although an approximate dimension for the individual device package 202 is given, it should be understood that this is not intended to be limiting and a device package of any dimension may be provided. Referring more specifically to FIG. 17, illustrated is an array 214 showing a row of overlapping optoelectronic device packages 216, 218, 220 and 222, each generally similar to device package 202, configured in a parallel shingling layout. The array 214 is configured wherein the transparent portion of the edge seal zone 212 of device 222 overlaps electroactive area 213 of device 220 and the transparent portion 212 of device 220 overlaps electroactive area 213 of device 218. Furthermore, the transparent portion of the edge seal zone 212 of device 218 overlaps electroactive area 213 of device 216 and transparent portion 212 of device 216, although depicted as not overlapping an additional package, may overlap an electroactive area 213 of an additional device where provided. Light emitted by an OLED, and more particularly the electroactive areas 213 or each device 216, 218, 220, and 222, or to be absorbed by a PV device, is able to pass through the overlapped transparent portions 212. For an OLED, electroactive areas 213 of each device 216, 218, 220, and 222 may be positioned without an intervening non-light emitting area, forming a continuous light emitting area. It should be noted that the present invention is not limited to packages having a transparent edge seal zone; in such embodiments, light emitting or light absorbing areas may be separated by non-emitting/absorbing areas.

Figure 18:
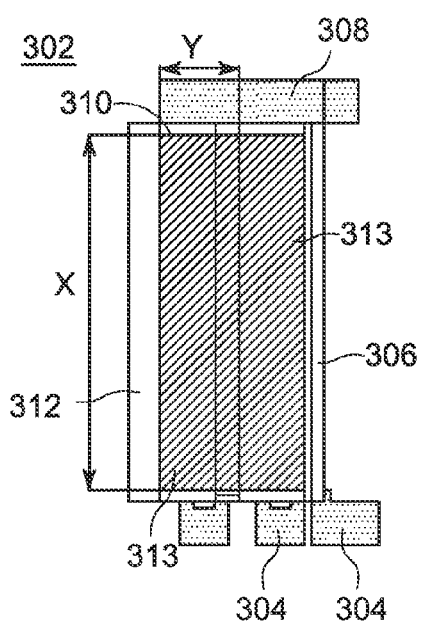
FIG. 18 is a schematic view of an optoelectronic device package for use in the array according to an embodiment.
Figure 19:
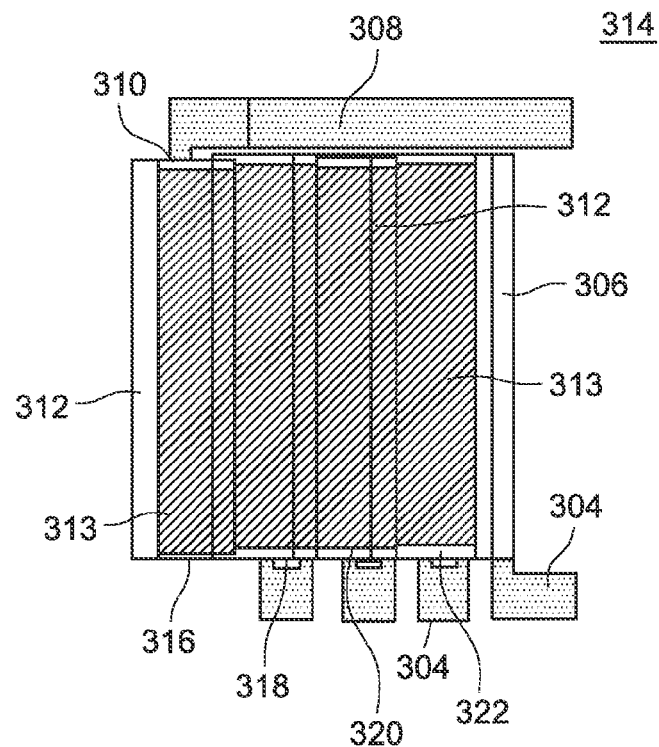
FIG. 19 is an array according to an embodiment showing overlapping packaged optoelectronic devices of FIG. 18 oriented in series with each other.

FIGS. 18 and 19 are schematics view of an individual optoelectronic device package and electrical connections, generally referenced 302, and an array 314 showing a plurality of overlapping packages 316, 318, 320, and 322, generally similar to device package 302, configured in a series shingling layout and addressable in series. A transparent portion of edge seal zone 312 of a device 322 overlaps electroactive area 313 of device 320, and a transparent portion of edge seal zone 312 of device 320 overlaps electroactive area 313 of device 318, and a transparent portion of edge seal zone 312 of device 318 overlaps electroactive area 313 of device 316, forming a continuous light emitting or absorbing area on one surface of the array. Electrical connections are provided to the individual packages wherein the anode contact tabs 304, and more particularly the anode bus lines 306, are in electrical communication to provide series addressing of the plurality of packages 316, 318, 320 and 320 in array 314. A plurality of second electrical conductive tab 308 are provided in electrical communication with a cathode 310, generally similar to cathode 121 previously described.

Figure 20:
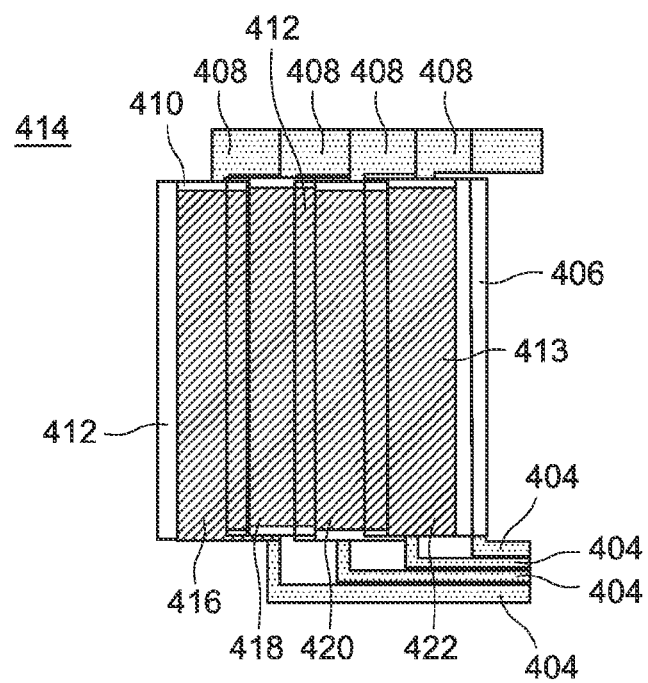
FIG. 20 is an array according to an embodiment showing overlapping and individually addressable packaged optoelectronic devices.

FIG. 20 provides a schematics view of an array 414 of a plurality of individually addressable optoelectronic device packages 416, 418, 420, and 422. In the illustrated embodiment electrical connections 404 and 408 are provided to each individual optoelectronic device package 416, 418, 420, and 422 and provide individual addressing of each device. Illustrated are the plurality of overlapping packages 416, 418, 420, and 422, each generally similar to device package 202 of FIG. 16, configured in a shingling layout and addressable individually. A transparent portion of edge seal zone 412 of a device 422 overlaps electroactive area 413 of device 420, and a transparent portion of edge seal zone 412 of device 420 overlaps electroactive area 413 of device 418, and a transparent portion of edge seal zone 412 of device 418 overlaps electroactive area 413 of device 416, forming a continuous light emitting or absorbing area on one surface of the array 414. Electrical connections are provided to the individual packages in the non-transparent edge seal zone, wherein the anode contact tabs 404, and more particularly the anode bus lines 406 of each individual package provides individual addressing of the plurality of packages 316, 318, 320 and 320 in array 314. A plurality of second electrical conductive tab 408 are provided in electrical communication with a cathode 410, generally similar to cathode 121 previously described.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. An optoelectronic device package comprising
an edge seal zone defining a transparent portion along a first edge portion and a second edge portion, wherein the first and second edge portions are geometrically parallel portions of the optoelectronic device package; and
an edge seal zone defining a non-transparent portion along a third edge portion and a fourth edge portion, wherein the third and fourth edge portions are geometrically parallel edge portions, and oriented substantially orthogonal to the first edge portion and the second edge portion of the optoelectronic device package, wherein at least one of the transparent first and second edge portions of the edge seal zone overlaps at least one adjacent optoelectronic device package; and the non-transparent third and fourth edge portions of the edge seal zone comprising a conductive layer connecting an anode and a cathode of the optoelectronic device to an external power source via a plurality of contacts, wherein the cathode and the anode extend through the non-transparent portion of the edge seal zone.

2. An optoelectronic device package according to claim 1, wherein the anode is an anode bus line longitudinally oriented.

3. An optoelectronic device package according to claim 1, wherein the anode and the conductive layer in the non-transparent portion of the edge seal zone are electrically isolate the anode from the cathode.

4. An optoelectronic device package according to claim 3, wherein
the cathode and the anode extend through the non-transparent portion of the edge seal zone;
the conductive layer is disposed directly on an electroactive layer; and
an electrically insulating layer is disposed between the anode and the conductive layer in the non-transparent portion of the edge seal zone to electrically isolate the anode from the cathode.

5. An optoelectronic device package according to claim 3, wherein
the cathode extends through the non-transparent portion of the edge seal zone;
the conductive layer is disposed directly on an electroactive layer; and
the anode is an anode bus line spaced a distance from the electroactive area in the transparent portion of the edge seal zone to electrically isolate the anode from the cathode.

6. An array comprising:
a plurality of optoelectronic device packages positioned in at least one row, each optoelectronic device package enclosing an optoelectronic device comprising:
an edge seal zone defining a transparent portion along a first edge portion and a second edge portion, wherein the first and second edge portions are geometrically parallel portions of the optoelectronic device package; and
an edge seal zone defining a non-transparent portion along a third edge portion and a fourth edge portion, wherein the third and fourth edge portions are geometrically parallel edge portions, and oriented substantially orthogonal to the first edge portion and the second edge portion of the optoelectroic device package,
wherein at least one of the transparent first and second edge portions of the edge seal zone is configured to overlap at least one adjacent optoelectronic device package; and
wherein the non-transparent third and fourth edge portions of the edge seal zone comprising a conductive layer connecting an anode and a cathode of the optoelectronic device to an external power source via a plurality of contacts,
wherein the cathode and the anode extend through the non-transparent portion of the edge seal zone, and
wherein each optoelectronic device package overlaps at least one adjacent optoelectronic device package.

7. An array according to claim 6, wherein each of the plurality of optoelectronic device package comprises a single pixel.

8. An array according to claim 6, wherein the plurality of optoelectronic device packages are configured to form one of a continuous or non-continuous light emitting area.

9. An array according to claim 6, wherein at least a portion of the transparent portion of the edge seal zone of each optoelectronic device package in the array overlaps an electroactive area of an adjacent package.

10. An array according to claim 6, wherein edges of the transparent portion of the edge seal zone of each package are aligned in parallel.

11. An array according to claim 6, wherein the non-transparent portion of the edge seal zone comprises the conductive layer connecting an anode and a cathode of the optoelectronic device to an external power source via a plurality of contacts.

12. An array according to claim 6, wherein the anode is an anode bus line oriented substantially parallel to the transparent portion of the edge seal zone.

13. An array according to claim 6, wherein the anode and the conductive layer in the non-transparent portion of the edge seal zone electrically isolate the anode from the cathode.

14. An array according to claim 13, wherein
the cathode and the anode extend through a non-transparent portion of the edge seal zone;
the conductive layer is disposed directly on an electroactive layer; and
an electrically insulating layer is disposed between the anode and the conductive layer in the non-transparent portion of the edge seal zone to electrically isolate the anode from the cathode.

15. An array according to claim 13, wherein
the cathode extends through a non-transparent portion of the edge seal zone;
the conductive layer is disposed directly on an electroactive layer; and
the anode is an anode bus line spaced a distance from the electroactive area in the transparent portion of the edge seal zone to electrically isolate the anode from the cathode.

16. An array according to claim 6, wherein each optoelectronic device is an OLED.

17. An array according to claim 6, wherein each optoelectronic device is photovoltaic device.

18. An OLED lighting array forming a continuous lighted area, said OLED lighting array comprising a plurality of packages, each enclosing an optoelectronic device, and arranged in at least one row;
each package comprising an electroactive area and an edge seal zone defining a transparent portion and a non-transparent portion, the non-transparent portion comprising a conductive layer connecting an anode and a cathode of the optoelectronic device to an external power source via a plurality of terminals wherein the anode and the cathode extend through the non-transparent portion of the edge seal zone,
wherein the transparent portion of the edge seal zone of each package overlaps the electroactive area of an adjacent package;
wherein the electroactive area of each adjacent package in the row overlaps the non-transparent portion of the edge seal zone of an adjacent package in the row; and
wherein the transparent edges of each package are aligned along a linear anode bus line.

* * * * *